United States Patent [19]

van Berkum et al.

[11] Patent Number: 5,272,114

[45] Date of Patent: Dec. 21, 1993

[54] METHOD FOR CLEAVING A SEMICONDUCTOR CRYSTAL BODY

[75] Inventors: Petrus A. van Berkum, Elmhurst; Ronald P. Mathius, Bridgeview, both of Ill.

[73] Assignee: Amoco Corporation, Chicago, Ill.

[21] Appl. No.: 950,635

[22] Filed: Sep. 21, 1992

Related U.S. Application Data

[63] Continuation of Ser. No. 624,557, Dec. 10, 1990, abandoned.

[51] Int. Cl.$^5$ .................. H01L 21/302; H01L 21/306
[52] U.S. Cl. .......................... 437/226; 437/227
[58] Field of Search ........................ 437/226, 227; 148/DIG. 28, DIG. 95, DIG. 168

[56] References Cited

U.S. PATENT DOCUMENTS

| | | | |
|---|---|---|---|
| 4,604,161 | 8/1986 | Araghi | 437/226 |
| 4,822,755 | 4/1989 | Hawkins et al. | 437/227 |
| 4,883,771 | 11/1989 | Kumabe et al. | 437/227 |
| 4,961,821 | 10/1990 | Drake et al. | 437/226 |
| 5,128,282 | 7/1992 | Ormond et al. | 437/226 |
| 5,196,378 | 3/1993 | Bean et al. | 437/226 |

FOREIGN PATENT DOCUMENTS

| | | | |
|---|---|---|---|
| 219975 | 12/1984 | Japan | 437/226 |

OTHER PUBLICATIONS

Tocci, "A Procedure to Produce Flat III-IV Substrate Material for Optoelectronic Devices", RCA Tech. Notes, May 13, 1986, TN No.: TN-1376 pp. 1-2.

Primary Examiner—Olik Chaudhuri
Assistant Examiner—Ken Horton
Attorney, Agent, or Firm—Stephen G. Mican

[57] ABSTRACT

A method for cleaving a semiconductor crystal body having a first surface and an opposite second surface, comprising the steps of forming a channel on the first surface of the semiconductor, scribing a portion of the second surface opposite the channel on the first surface, and mechanically cleaving the semiconductor along a plane defined by said channel on the first surface and said scribe on the second surface.

20 Claims, 2 Drawing Sheets

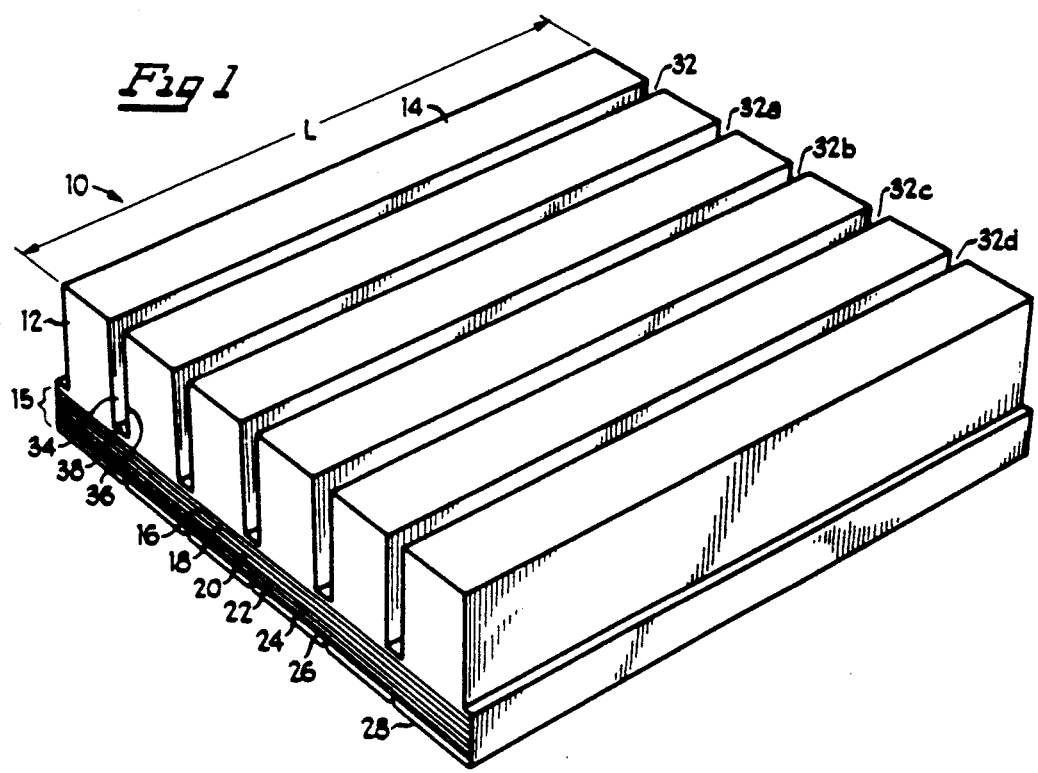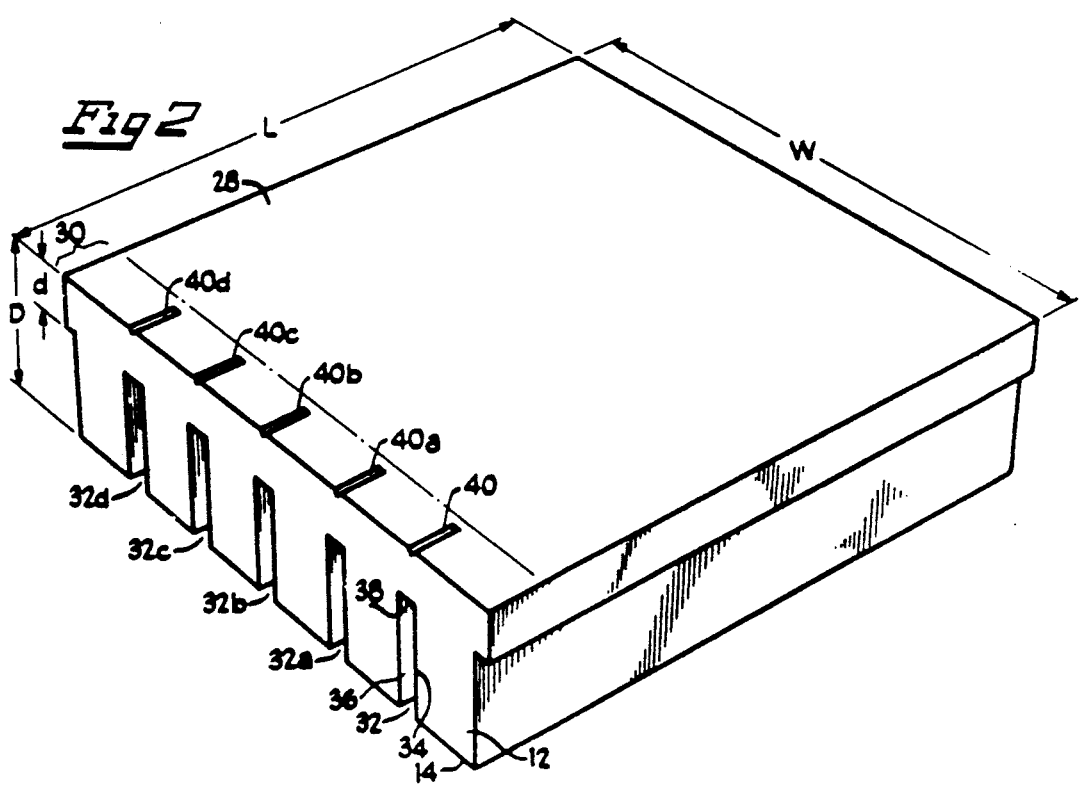

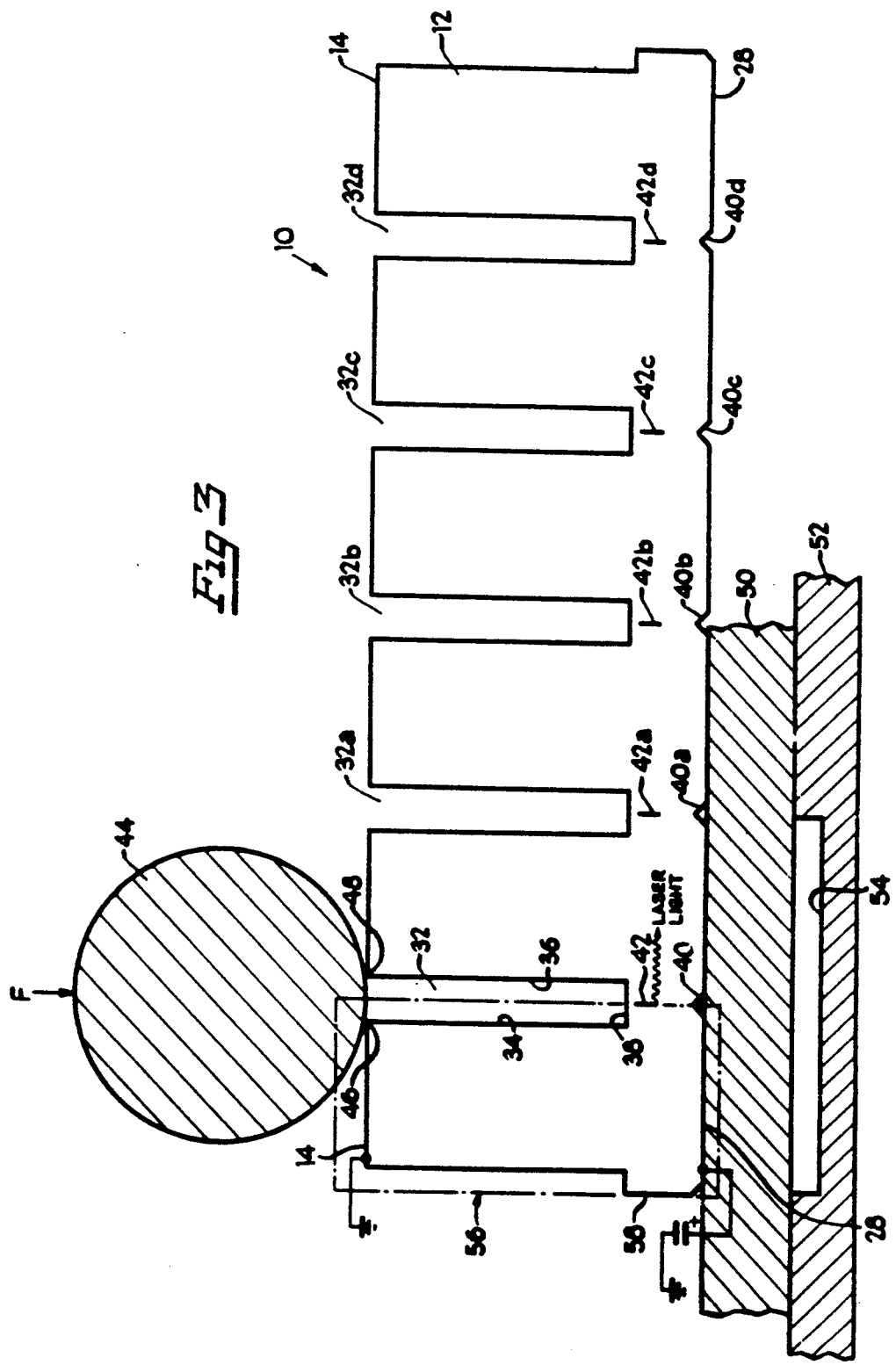

METHOD FOR CLEAVING A SEMICONDUCTOR CRYSTAL BODY

This is a continuation of application Ser. No. 07/624,557, filed Dec. 10, 1990, now abandoned.

FIELD OF THE INVENTION

This invention relates to a method for cleaving a semiconductor crystal body having a first surface and an opposite second surface, comprising the steps of forming a channel on the first surface of the semiconductor, scribing a portion of the second surface opposite the channel on the first surface, and mechanically cleaving the semiconductor along a plane defined by the channel on the first surface and the scribe on the second surface.

BACKGROUND OF THE INVENTION

A laser is a device which has the ability to produce monochromatic, coherent light through the stimulated emission of photons from atoms, molecules or ions of an active medium which have typically been excited from a ground state to a higher energy level by an input of energy. Such a device contains an optical cavity or resonator which is defined by highly reflecting surfaces which form a closed round trip path for light. The active medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and passage of an electrical current through the p-n junction of a semiconductor laser. Semiconductor lasers contain a p-n junction which forms a diode, and this junction functions as the active medium of the laser. Such devices are also referred to as laser diodes. The efficiency of such lasers in converting electrical power to optical output power is relatively high, and for example, can be in excess of 25 percent.

In order to effect efficient optical pumping, the photons from a pump source such as a Nd:YAG laser, to the lasant material must have a wavelength in a very narrow range.

It is not uncommon for laser diodes to have lifetimes in excess of 50,000 hours. However, certain factors adversely effecting the lifetimes of laser diodes include high device temperature, current spikes and imperfect output facets.

A laser diode can be fabricated by cleaving a crystalline semiconductor material on which appropriate epitaxial layers are deposited along at least two crystal planes thereby forming an optical cavity, with a pair of oppositely placed facets or mirrors. One of the facets can be coated with a highly reflective coating, and the other with a partially reflective coating. If sufficient current flows through the p-n junction formed by the epitaxial layers or if the structure is optically pumped, lasing occurs and laser light will escape through the partially reflective coated facet.

Device failure due to imperfect output facets can result in degradation instantly or gradually. It is caused by striations and microcracks on the output facet of lasers, thermal effects and the combination of the above in conjunction with thermal oxidation.

Striations, as used herein, are undesirable deviations of a cleavedplane from an ideal flat surface coinciding with a crystal plane. During the cleaving step, undesirable striations are generated when the cleaved plane does not coincide with a single plane. Striations can adversely affect device yield and result in more rapid degradation of optical radiation sources, thus reducing their lifetime.

Over the years a number of methods for producing separate semiconductor components from a semiconductor crystal body have been suggested, such as U.S. Pat. Nos. 3,542,266, 2,970,730 and 4,237,601. These methods have met with varying degrees of success.

U.S. Pat. No. 4,237,601 is directed to a method of cleaving a semiconductor wafer into individual devices, said wafer comprising a substrate, at least a portion of one surface of which is metallized, and a plurality of semiconductor layers deposited on at least a portion of the opposite surface, at least one of which layers, when appropriately biased, generates coherent electromagnetic radiation, which method includes: (a) forming channels of substantially parallel sidewalls about 1 to 4 mils deep in the substrate, said substrate being at least about 6 mils thick; (b) etching into the substrate with an anisotropic etchant to a depth sufficient to form V-grooves in the bottom of the channels, said V-grooves terminating at a point before reaching the said one layer; and (c) mechanically cleaving the wafer including the said one layer along the etched grooves to form bars of diodes. The examples illustrate a high density of striations and damage to the lasing facets along the plane of cleaving. Thus, there remains a need in the art for a method of cleaving semiconductor crystal bodies, resulting in increased device yields and reduced striations on lasing facets, to provide a substantial improvement over prior art techniques.

It is therefore desirable to provide an improved method for cleaving a semiconductor crystal body, which overcomes most if not all of the aforementioned problems.

SUMMARY OF THE INVENTION

An embodiment of the present invention includes a method for cleaving a semiconductor crystal body having a first surface and an opposite second surface, comprising the steps of: (a) forming a channel on the first surface of the semiconductor; (b) scribing a portion of the second surface opposite said channel on the first surface; and (c) mechanically cleaving the semiconductor along a plane defined by said channel on the first surface and said scribe on the second surface.

Another embodiment of the invention includes a method for cleaving a semiconductor crystal body, said semiconductor crystal body comprising a substrate having a plurality of semiconductor layer deposited epitaxially thereon, wherein at least one of said layers when appropriately biased generates electromagnetic radiation, and wherein said semiconductor crystal body has a first surface and an opposite second surface, comprising the steps of: (a) forming a plurality of substantially parallel channels across the first surface of the semiconductor crystal body; (b) making a plurality of scribes along a portion of the second surface opposite said channels on the first surface; and (c) mechanically cleaving the semiconductor body along each plane defined by one of said channel-on the first surface and said opposing scribe on the second surface.

The principal object of the present invention is to provide a new and improved method of mass producing optoelectronic semiconductor components with high quality facets from a single semiconductor crystal body.

A further object of the present invention is to provide a method of mass producing optoelectronic semiconductor components which avoids the disadvantages inherent in the methods of the prior art.

Another object of the present invention is to provide a method of mass producing optoelectronic semiconductor components without causing crystal damage to the semiconductor body from which the components are produced.

An object of the present invention is to provide a method of mass producing optoelectronic semiconductor components for sources of optical pumping radiation, such as laser diodes, light-emitting diodes, laser diode arrays and the like, substantially free or having a low density of striations on the lasing facets.

Another object of the present invention is to provide a simple, reliable, effective and efficient method of mass producing separate optoelectronic semiconductor components from a single semiconductor crystal body with appropriate epitaxial layers.

BRIEF DESCRIPTION OF THE DRAWINGS

FIG. 1 of the drawings is a perspective view of a semiconductor crystal body suitable for use in the practice of this invention.

FIG. 2 of the drawings is a perspective view of the opposite side of semiconductor crystal body in FIG. 1 suitable for use in the practice of this invention.

FIG. 3 of the drawings is an enlarged front view of FIG. 1.

DETAILED DESCRIPTION OF THE DRAWINGS

While this invention is susceptible of embodiments in many forms, there are shown in FIGS. 1-3 various views which are intended to help clarify the present invention, with the understanding that the present disclosure is not intended to be limited by the sketches herein.

Referring to FIG. 1, a semiconductor crystal body 10 is illustrated from which a source of optical radiation, such as, for example, a laser diode, light-emitting diode, laser diode array, and the like, can be fabricated. The semiconductor 10 includes a substrate 12 on a portion of which is normally grown several successive layers or epitaxial layers. The semiconductor body 10 includes a first surface 14, epitaxial layers 15 comprising confining layer 16, waveguide layer 18, layer 20, waveguide layer 22, confining layer 24, and cap 26, and opposite the first surface 14 is a second surface or conductive layer 28. The fabrication of this semiconductor crystal body 10, as well as other laser diode structures, can be carried out by, for example, liquid-phase epitaxy, molecular beam epitaxy or metal-organic chemical vapor deposition, and the like, which techniques are known in the art.

More particularly, the substrate 12 of FIG. 1 comprises a n+ GaAs material. In a preferred embodiment, a conductive layer is applied over first surface 14, the layer comprises layers of gold-germanium, nickel and gold for electrical conductivity. Confining layers 16 and 24 can vary widely in thickness and composition, preferably such layers are about 1 $\mu$m thick and comprise n-doped $Al_xGa_{1-x}As$ and p-doped $Al_{x'}Ga_{1-x'}As$, respectively. Waveguide layers 18 and 22 can vary widely in thickness and composition, and preferably are less than or about equal to 0.2 $\mu$m thick and comprise $nAl_y$-$Ga_{1-y}As$ and $pAl_{y'}Ga_{1-y'}As$, respectively. Layer 20 is an active region or quantum well which can vary widely in thickness and composition. Typically, the thickness is less than or about equal to 0.02 $\mu$m, and comprises unintentionally doped $Al_zGa_{1-z}As$. The values for x and x', y and y', and z can range greatly, preferably they range from about 0.3 to 1.0, 0.1 to 0.5, and 0.0 to 0.1, respectively. Layer 26 is a cap layer which can range widely in thickness and composition, preferably layer 26 is less than or about equal to 0.2 $\mu$m thick and comprises p+GaAs. The second surface 28 is a conductive layer, preferably comprising layers of titanium, platinum and gold or equivalent thereof which is known in the art. The above geometry represents a preferred embodiment. However, as recognized by those skilled in the art, the conductivity and number of layers can be revised or modified, and other configurations and geometries are possible, if desired, in any conventional form known in the art.

The instant invention includes a method for cleaving a semiconductor crystal body 10 having a first surface 14 and an opposite second surface 28, comprising the steps of forming a channel 32 on the first surface 14 of the semiconductor 10, as illustrated in FIG. 1, scribing a portion of the second surface 28 opposite said channel 32 on the first surface 14 with a "scribe" 40, as illustrated in FIG. 2, and mechanically cleaving the semiconductor 10 along a plane 42 defined by said channel 32 on the first surface 14 and a scribe 40 on the second surface 28, as illustrated in FIG. 3.

The resulting device can be utilized as a source of optical radiation. The cleaved-lasing facets are substantially free of striations and microcracks. The cleaving plane can be either parallel or perpendicular to the major flat of commercially available GaAs wafers.

Scribing, as used herein, is defined as scratching or superficially cutting, either (i) mechanically with for example, a sharp-pointed often diamond tipped instrument or (ii) optically with for example, a laser, along a straight line on the surface of a crystal body with or without epitaxial layers. Examples of scribing can be found in U.S. Pat. Nos. 2,970,730 and 3,542,266.

Referring to FIG. 1, the channel forming step includes forming a channel 32 along and across the entire length L of first surface 14 of the semiconductor 10. The channel 32 includes substantially parallel first and second sidewalls 34 and 36, respectively, which are substantially perpendicular to first and second surfaces 14 and 28, to facilitate handling of the end product or device. Between and below the first and second sidewalls 34 and 36, is a substantially flat section or channel bottom 38. The flat section 38 is substantially perpendicular to first and second sidewalls 34 and 36, and substantially parallel to first and second surfaces 14 and 28. The flat section 38 provides a wide area across the length L, between the first and second sidewalls 34 and 36, where the scribe 40 can be made opposite thereof on second surface 28. During the cleaving step, the cleave propagates along a crystal plane which originates from and contains scribe 40, producing a cleaved surface substantially free of striations.

The substantially flat section 38 provides freedom for the plane 42 to be defined along a smooth crystal path, defined by scribe 40 and section 38 during the cleaving step. This freedom would not be permitted if the flat section 38 were V-shaped.

Referring to FIG. 2, the channel 32 can be formed by any appropriate means, preferably it is formed by sawing a thin channel to a predetermined depth, determined by the mathematical formula D-d, along the first surface 14 of semiconductor 10. The channel depth D-d is bound by the following constraints. The channels are deep enough to facilitate cleaving along crystal plane 42, yet shallow enough so as to avoid the epitaxial layers 15, and provide sufficient strength during handling. Channel 32 area depth d is thinner than the surrounding area D. Thus, upon application of a force along channel 32, the channel area will tend to cleave more readily along depth d in proximity to plane 42, and across length L, than the area between such channels, resulting in higher yields with improved lasing facets.

The channels can be formed simultaneously or preferably, by forming a plurality of channels in succession, for example, by sawing or forming the channels 32, 32a, 32b, 32c, 32d, etc. in succession, by mass production means or robotics. The channels herein can be formed using a diamond circular saw blade. The saw blade can vary widely in thickness, preferably the blade is about 80 microns thick for forming well defined, rectangular channels of predetermined widths and lengths. Having rectangular channels with substantially uniform widths and lengths is advantageous from the standpoint that the sidewalls 34 and 36 provide an area for improved handling of the final device, by providing an area to hold on to or squeeze, without damaging the active region 20 or laser facet.

Sawing the channel 32 can cause undesirable microcracks in proximity to the epitaxial layers 15, thereby decreasing the useful life of the semiconductor device which is being fabricated. In a preferred embodiment, channels 32, 32a, 32b, 32c, and 32d are etched to substantially remove microcracks and defects surrounding and in proximity to such channels, and to produce a substantially flat bottom 38 of the channels, thereby providing a wide area in which to scribe opposite thereof. By etching away about 1 mil or less of the surrounding damaged material from channels 32, 32a, 32b, 32c, and 32d, the possibility of microcracks propagating outwardly is substantially minimized, thereby enhancing the useful life of the device eventually produced. The channels can be etched after the scribing step, or preferably, between the channel forming step and the scribing step, thereby etching away only the channels 32, 32a, 32b, 32c, 32d, etc. areas without affecting the scribes.

In a preferred embodiment, the etching step includes applying an etchant solution on the first surface 14 including channels 32, 32a, 32b, 32c, and 32d, thereby attacking microcracks in, around, emanating from and in proximity to the channels 32, 32a, 32b, 32c, and 32d. When the semiconductor is comprised of GaAs, the etchant can be either a mixture of NaOH, $H_2O_2$ and $H_2O$; or a mixture of $NH_4OH$, $H_2O_2$ and $H_2O$; or preferably a mixture of $H_2SO_4$, $H_2O_2$ and $H_2O$, in a 1:8:10 ratio by volume to produce a flatter bottom 38 of the channels, which provides a wide area in which to scribe opposite thereof.

In a preferred embodiment, after the etching step, the semiconductor 10 can be alloyed or annealed for a sufficient time to produce a good ohmic contact between the first surface 14 of substrate 12 and the conductive layer attached thereto. The alloying step can include rapid thermal annealing or simply placing the semiconductor 10 in a chamber at an elevated temperature, such as between 350° C. to 450° C. for a sufficient period of time, such as about 3 to 4 minutes, to produce a good ohmic contact between first surface 14 and substrate 12.

Referring to FIG. 2, the scribing step includes making a substantially V-shaped groove, scribe 40 or scratch along at least a portion of the second surface 28, opposite the channel 32 on the first surface 14. Preferably, the scribe 40 is made near the end or edge portion 30 of the second surface 28 to facilitate cleaving. In a preferred embodiment, a plurality of scribes 40, 40a, 40b, 40c, and 40d opposite the flat sections 38 of channels 32, 32a, 32b, 32c, and 32d, respectively, are formed in succession, for mass producing the components. Also, in a preferred embodiment, the scribing step includes substantially centering scribes 40, 40a, 40b, 40c, 40d, etc. between the sidewalls 34 and 36 of each channel 32, 32a, 32b, 32c, and 32d of the first surface 14 for improved cleaves having a low density of striations.

The scribes provide a weak and brittle area where the cleaves begin or are initiated from. During the cleaving step, the cleave is initiated in proximity to the scribe 40 and travels toward flat section 38 and substantially simultaneously, travels along the length L of channel 38 along plane 42. The scribes are necessary to obtain facets having a low density of striations.

The semiconductor 10 includes a thickness or depth D which can vary widely. Commercially available wafers have a thickness D of less than about 600 μm. The depth d or thickness defined by the distance from the flat section 38 of channel 32 to the second surface 28 can vary widely. In one embodiment, d is about 4 mils or more for improved cleaving. Referring to FIG. 2, the ratio d/D can range widely, for example d/D ranges from about 0.75 or less, preferably about 0.5 to about 0.1, and most preferably about 0.3. D is determined by the thickness of commercially available GaAr wafers. While small d is governed by ease of cleaving and fragility of the semicondor 10 with the channels. In one embodiment, the scribes are located exactly above the center of the channels, and substantially parallel to the longitudinal direction L of the channels, for producing improved cleaves. The scribes can be made by any appropriate means, preferably a Loomis scriber, for consistent and uniform scribes. The scriber was obtained from Loomis Industries, Inc., 1210 Church Street, Saint Helena, Calif.

Referring to FIG. 3, after the channel forming and scribing steps in FIGS. 1 and 2, the semiconductor 10 is mechanically cleaved to produce a cleaved plane 42 which ideally coincides with a crystal plane. The plane 42 is defined by the flat section 38 of channel 32 on the first surface 14, and the scribe 40 on the second surface 28. Preferably, the cleaved plane 42 comprises scribe 40 on second surface 28 and is substantially perpendicular to first and second surfaces 14 and 28. For mass production purposes, after cleaving plane 42, cleaves are subsequently made along planes 42a, 42b, 42c, and 42d, which are defined by the flat section 38 of channels 32a, 32b, 32c, and 32d on the first surface 14 and the scribes 40a, 40b, 40c, and 40d on the second surface 28, respectively. High quality facets for radiation sources can result.

In one embodiment of the invention, the cleavages can be made by utilizing a cleaving means 44. The cleaving means 44 can comprise, for example, any blunt and substantially rigid instrument, such as a barrel, roller, rod, etc. Referring to FIG. 3, in a preferred embodiment, a transparent rod is utilized for facilitating alignment and producing improved facets of laser diode bars with long lengths L, such as 1 cm or more.

The cleaving step includes positioning cleaving means 44 substantially on, along and aligned with the channel 32 of the first surface 14, as illustrated in FIG. 3. Thereafter, a force F is applied in a direction substantially in alignment with the plane 42 and the center of cleaving means 44, in a direction downwardly toward scribe 40, and substantially perpendicular to first and second surfaces 14 and 28, as illustrated in FIG. 3. The cleaving means 44 has been designed and configured so as to touch and contact apices 46 and 48 of channel 32, to automatically align cleaving means 44 with the channel 32, thereby facilitating alignment and improving device yield.

In one embodiment, a resilient or rubber pad 50 is positioned on a rigid surface 52 having a rectangular channel 54. The semiconductor 10 is positioned adjacent to the pad 50 so that second surface 28 faces and contacts pad 50. The channel 54 width, on rigid surface 52, is about twice the distance as the distance from plane 42 to 42a of the semiconductor 10 in FIG. 3, so that upon applying force F, the semiconductor 10 will tend to crack or cleave along plane 42, which is the weakest area, producing cleavages with decreased numbers of striations along plane 42, lasing facet and active region 20. During the cleaving step, preferably the force F is exerted from cleaving means 44 in a direction toward pad 50. It is believed that the cleave substantially starts to propagate from scribe 40 toward the flat section 38 of channel 32 and along the length L of channel 32 substantially simultaneously. The force F can vary widely, preferably said force F is applied substantially consistently across the length L of the channel 38.

The pad 50 provides a cushion and yielding surface, to minimize the possibility of damaging, cracking or chipping semiconductor 10. After the first plane 42 is cleaved, other semiconductor components can be easily mass produced by moving the semiconductor 10 or surface 52 and cleaving means 44 to and in alignment with channels 32a, 32b, 32c, 32d, etc. to cleave planes 42a, 42b, 42c, 42d, etc. The resulting devices are utilized as sources of optical radiation, such as a laser diode or the like.

As previously stated, the semiconductor crystal body 10 is cleaved into individual devices or sources of optical radiation having lasing facets along plane 42, and the subsequent planes 42a, 42b, 42c, and 42d. Planer mirror facets are formed by cleavage along such planes. Referring to FIG. 3, following the cleaving step along plane 42, an optical source 56 is produced. The optical source 56 is coated with a highly reflective coating on planar surface 58 and an anti-reflective coating on plane 42, to allow laser light to pass through the latter when appropriately biased. In operation, when appropriately forward biased, for example, by applying a negative voltage to first surface 14 and a positive voltage to second surface 28, light is emitted from the active region or layer 20 in a direction approximately perpendicular to the direction of current flow or plane 42.

Although only one embodiment of this invention has been shown and described, it is to be understood that various modifications and substitutions, as well as rearrangements and combinations of the preceding embodiment, can be made by those skilled in the art without departing from the novel spirit and scope of this invention.

EXAMPLE 1

A commercially available Galium Arsenide wafer (Round shape-Single crystal) No. 700055-023, was obtained from Sumitomo Electric Industries, Ltd. The wafer was 450 ±25 µm thick, had n-type conduction, the dopant was silicon and the carrier concentration was $1.1-1.5 \times 10^{18}/cm^3$. The second surface was metalized with a 118 Å layer of titanium, 308 Å layer of platinum and 2007 Å layer of gold. The first surface was metalized with 1109 Å layer of gold-germanium, 213 Å layer of nickel and 5006 Å layer of gold. A plurality of channels with 20 mil centers were formed on the first surface by utilizing a Disco Dicing saw with a diamond circular saw blade. The first surface channels were etched with a mixture of $H_2SO_4$, $H_2O_2$ and $H_2O$ in a 1:8:10 ratio, by volume, for five minutes at 20° C. Subsequently, the first surface was alloyed with a Rapid Thermal Anneal machine at 425° C. for 10 seconds. On the second surface, opposite the channels, V-shaped scribes were made with a Loomis Scriber at 1.0 psi about 12-14 mils long. Finally, the wafer was mechanically cleaved along each plane defined by the scribes on the second surface, substantially perpendicular to the second and first surfaces. Twenty bars each about one centimeter long were produced. Superior cleaved surfaces were produced. On a Polyvar Met Reichert-Jung microscope in the Nomarski mode at a magnification of 250 times, less than one striation per millimeter was observed, between and excluding the scribe at one end across the entire length of the bar to the other end, for each of the twenty bars herein.

Comparison A

A second sample from the same wafer was tested as in Example 1. In Comparison A, the second surface was not scribed, and the first surface was metalized with the same layers as in Example 1, after the channel forming step. The channels in comparison A were not etched. Five bars each about one centimeter long were produced. A great deal of force was required to cleave these 1 cm long bars. Poor quality facets were produced having more than 100 striations per millimeter as observed on the above microscope.

We claim:

1. A method for cleaving a semiconductor crystal body having a first surface and an opposite second surface, comprising the steps of:
   a) forming a channel on the first surface of the semiconductor, said channel including sidewalls and a bottom therebetween;
   b) scribing a portion of a total length of the second surface opposite said channel and between the planes of said sidewalls thereof on the first surface; and
   c) mechanically cleaving the semiconductor along a plane defined by said channel on the first surface and said scribe on the second surface.

2. The method of claim 1, wherein a plurality of parallel channels are formed on the first surface of the semiconductor.

3. The method of claim 1, wherein said channel extends across the first surface of the semiconductor.

4. The method of claim 2, wherein said formed channel is linear and includes substantially parallel side walls and a channel bottom therebetween.

5. The method of claim 2, wherein said channel forming step includes sawing up a substantially thin channel.

6. The method of claim 1, wherein said scribing step includes scribing a minor portion of the second surface in proximity to an edge of the semiconductor, opposite the channel on the first surface.

7. The method of claim 2, wherein a plurality of scribes on a minor portion of said second surface are made opposite to said channels on said first surface.

8. The method of claim 1, wherein said scribing step includes scribing a portion of said second surface centered with respect to said channel on said first surface.

9. The method of claim 4, wherein said semiconductor includes a thickness of about 4 mils or more from said channel bottom on the first surface to the scribe portion on the second surface opposite thereof.

10. The method of claim 1, wherein said semiconductor body is cleaved by aligning a rigid rod with said channel of said first surface, and applying a force in a direction substantially in alignment with said plane and said rod.

11. The method of claim 7, wherein said cleaving step is repeated for cleaving a plurality of individual components.

12. The method of claim 1, wherein said semiconductor crystal body comprises a plurality of semiconductor layers deposited epitaxially thereon, at least one of said layers when appropriately biased generates electromagnetic radiation.

13. The method of claim 1, additionally comprising the step of etching the formed channel after said channel forming step.

14. The method of claim 13, wherein said etching step includes applying an etchant to said channel, said etchant is selected from at least one member of the group consisting of: $H_2SO_4$, $H_2O_2$ and $H_2O$; NaOH, $H_2O_2$ and $H_2O$; and $NH_4OH$, $H_2O_2$ and $H_2O$.

15. The method of claim 1, additionally comprising the step of alloying a conductive layer to said semiconductor crystal body.

16. The method of claim 14, wherein said etchant comprises $H_2SO_4$, $H_2O_2$ and $H_2O$.

17. A method for cleaving a semiconductor crystal body, said semiconductor crystal body comprising a substrate having a plurality of semiconductor layers deposited epitaxially thereon, wherein at least one of said layers when appropriately biased generates electromagnetic radiation, and wherein said semiconductor crystal body has a first surface and an opposite second surface, comprising the steps of:
 a) forming a plurality of parallel channels having sidewalls and a bottom therebetween across the first surface of the semiconductor crystal body;
 b) making a plurality of scribes along a portion of a total length of the second surface opposite said channels and between the planes of said sidewalls thereof on the first surface; and
 c) mechanically cleaving the semiconductor body along each plane defined by one of said channels of the first surface and said opposing scribe on the second surface.

18. The method of claim 17, wherein said channels are formed by sawing rectangularly shaped channels along said first surface of the semiconductor.

19. The method of claim 17, wherein said scribes on said second surface are centered with respect to said channels on said first surface.

20. The method of claim 17, wherein the semiconductor is cleaved by applying a mechanical force in alignment with said plane.

* * * * *